United States Patent [19]

Tajima et al.

[11] Patent Number: 4,684,965

[45] Date of Patent: Aug. 4, 1987

[54] MONOLITHIC PROGRAMMABLE ATTENUATOR

[75] Inventors: Yusuke Tajima, Acton, Mass.; Toshikazu Tsukii, Santa Barbara, Calif.

[73] Assignee: Raytheon Company, Lexington, Mass.

[21] Appl. No.: 810,900

[22] Filed: Dec. 20, 1985

Related U.S. Application Data

[63] Continuation of Ser. No. 492,857, May 9, 1983.

[51] Int. Cl.[4] ............... H01L 29/50; H01L 29/52
[52] U.S. Cl. ............................. 357/22; 357/23.1; 357/23.14; 357/51; 330/253; 330/286; 437/8
[58] Field of Search ............... 357/22, 51, 23.1, 23.14; 330/253, 286; 29/574

[56] References Cited

U.S. PATENT DOCUMENTS

| | | | |
|---|---|---|---|
| 3,828,230 | 8/1974 | Nishizawa et al. | 357/23 D |
| 3,829,883 | 8/1974 | Bate | 357/23 MG |
| 3,995,174 | 11/1976 | Zrudsky | 357/23 MG |
| 4,182,024 | 1/1980 | Cometta | 29/574 |
| 4,216,451 | 8/1980 | Nishimura et al. | 357/51 |
| 4,272,775 | 6/1981 | Compton et al. | 357/22 |
| 4,298,879 | 11/1981 | Hirano | 357/22 |
| 4,430,623 | 2/1984 | Bert et al. | 33/286 |

FOREIGN PATENT DOCUMENTS 2632389  1/1978  Fed. Rep. of Germany .... 357/22 S

OTHER PUBLICATIONS

Sze *Physics of Semiconductor Devices* Wiley N.Y. 1981, pp 314–316.

*Primary Examiner*—Andrew J. James
*Assistant Examiner*—Jerome Jackson
*Attorney, Agent, or Firm*—Denis G. Maloney; Richard M. Sharkansky

[57] ABSTRACT

A programmable attenuator includes a plurality of field effect transistors (FETS) arranged together to provide an attenuation network. Each one of the FETS has a plurality of cell portions, each cell portion having drain, gate and source regions, the source and drain regions of the cell portions being connected in parallel. A first selected portion of the gate regions of each one of said FETS is connected to a gate electrode. A second selected remaining portion of the gate regions of each one of the FETS has the gate regions thereof isolated from the gate electrode. A signal fed to the gate electrode of each FET is distributed to the connected gate regions of each field effect transistor. In response to such signal, the total drain-source resistance of such FET is changed between a predetermined low value and a predetermined high value, with the resistance of the predetermined high value being determined, in part, by the number of such isolated gate regions.

5 Claims, 7 Drawing Figures

MONOLITHIC PROGRAMMABLE ATTENUATOR

This application is a continuation of application Ser. No. 492,857 filed May 9, 1983.

BACKGROUND OF THE INVENTION

This invention relates generally to radio frequency circuits and more particularly to radio frequency circuits for selectively attenuating a signal fed thereto.

As is known in the art, attenuators are used for a variety of applications, for automatic gain control circuits, and in particular, in broadband temperature compensated microwave amplifiers for temperature compensation of gain over an operating range of temperatures. One type of attenuator often used is a programmable attenuator. A programmable attenuator provides a selected predetermined fixed attenuation in response to a set of signals fed thereto. A general technique for providing a programmable attenuator, such as those described in U.S. Pat. No. 3,765,020 and U.S. Pat. No. 4,121,183, employs field effect transistors to selectively switch passive elements such as resistors to provide a properly configured attenuation network to thereby provide, in response to a signal fed to such network, a predetermined attenuated output signal. While these attenuators are useful in certain applications, one problem associated with these types of attenuators is that such circuits are not particularly well suited for fabrication on a common substrate such as by using monolithic microwave integrated circuit techniques since a resistor ladder network is required to provide attenuation, and an impedance matching network is required for matching the attenuator to external circuits.

SUMMARY OF THE INVENTION

In accordance with the present invention, a programmable attenuator includes a plurality of field effect transistor cells interconnected to provide an attenuation network. Each one of the field effect transistors has a plurality of cell portions, each cell portion having drain, gate and source regions, the source and drain regions of the cell portions being connected in parallel. A first selected portion of the gate regions of each one of said FETS is connected to a gate electrode. A second selected remaining portion of the gate regions of each one of the FET cells has the gate regions thereof isolated from the gate electrode. A signal fed to the gate electrode of each FET is distributed to the connected gate regions of each FET. In response to such signal, the total resistance of a drain-source channel of each FET is changed between a predetermined low resistance value and a predetermined high resistance value with the predetermined high resistance value being determined in part by the number of such isolated gate regions. With such an arrangement, by selecting values of channel resistance for the FET in the high state and the low state, an attenuation network may be provided to have a constant characteristic impedance related to the characteristic impedance of an input circuit connected thereto. Further, such a circuit can be easily fabricated on a common substrate using monolithic microwave integrated circuit techniques.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENT

Figure 1:
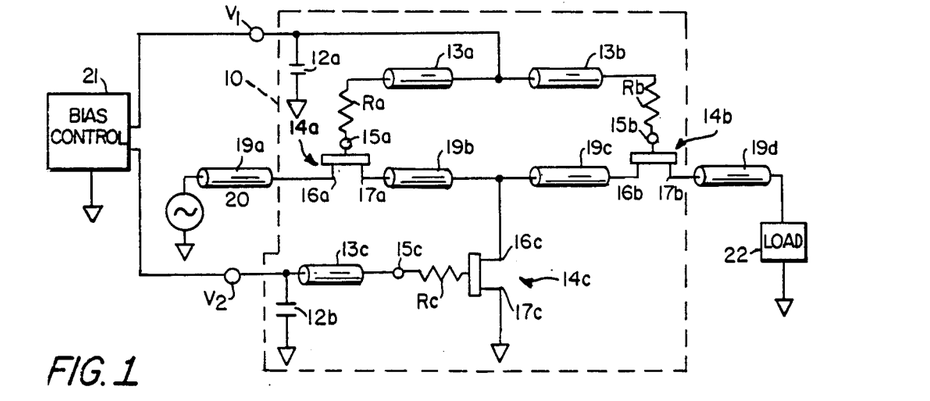
FIG. 1 is a schematic representation of an attenuator in accordance with the invention.

Referring now to FIG. 1, an r.f. energy source 20 is shown connected, via a radio frequency transmission line 19a to a 1-bit two state digital attenuator 10. The digital attenuator 10 is shown to include a plurality of field effect transistors, here 14a, 14b, 14c, each one of such field effect transistors having gate electrodes 15a, 15b, 15c, drain electrodes 16a, 16b, 16c and source electrodes 17a, 17b and 17c, respectively. Two of such field effect transistors (FET) here FETS 14a, 14b are connected in series with the input radio frequency transmission line 19a, and an output radio frequency (r.f.) transmission line 19d with the drain electrode 16a of FET 14a being connected to the r.f. transmission line 19a, source electrode 17a thereof being connected via transmission lines 19b, 19c to the drain electrode 16b of FET 14b and source electrode 17b being connected to the output transmission line 19d. Output r.f. transmission line 19d is connected to a load 22. Load 22 here has a characteristic impedance ($Z_o$) equal to 50 ohms. The third field effect transistor 14c connected in shunt between the interconnection of FETS 14a, 14b and ground, has drain electrode 16c connected at the interconnection of transmission lines 19b and 19c, and has source electrode 17c connected to ground, as shown.

Gate bias for gate electrodes 15a, 15b of field effect transistors 14a, 14b is provided at a bias terminal $V_1$. The gate bias circuit includes a decoupling capacitor 12a connected in shunt between terminal $V_1$ and ground, a first length of transmission line 13a connected between bias point $V_1$ and one end of a resistor $R_a$ with a second end of resistor $R_a$ being connected to gate electrode 15a of field effect transistor 14a, and a second, here equal length of transmission line 13b connected between bias point $V_1$ and a first end of a resistor $R_b$, the second end of resistor $R_b$ being connected to the gate electrode 15b of field effect transistor 14b. In a similar manner, the gate bias circuit for field effect transistor 14c includes a bypass capacitor 12b connected in shunt between ground and a bias point $V_2$ and a length of transmission line 13c connected between bias point $V_2$ and gate electrode 15c, and with resistor $R_c$ being connected to the gate electrode 15c and field effect transistor 14c.

Figure 2:
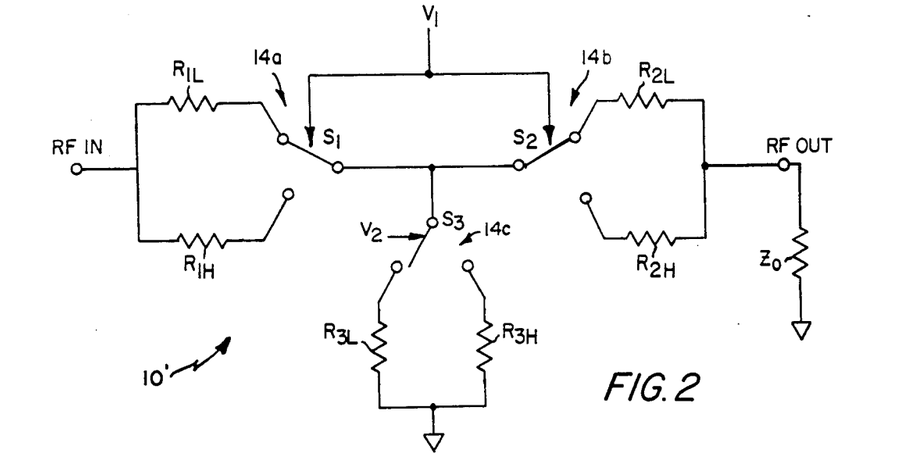
FIG. 2 is an equivalent circuit of the attenuator of FIG. 1.

By feeding voltage signals from here a bias control means 21 to terminal $V_1$ and to terminal $V_2$, the equivalent values of channel resistance of each FET 14a–14c here represented as resistors $R_1$, $R_2$, $R_3$ (FIG. 2A) will change between values of resistance $R_{1L}$, $R_{1H}$ and $R_{2L}$, $R_{2H}$ and $R_{3L}$, $R_{3H}$, respectively, in accordance with the value of the voltage level signal fed thereto. FET's 14a-14c are here depletion mode metal electrode semiconductor field effect transistors (MESFET's). Typically, a voltage level signal of zero volts with respect to the source electrode is applied to the gate electrode of such an FET to select a low value of channel resistance ($R_{1L}$, $R_{2L}$, $R_{3L}$) (FIG. 2) and a value of voltage corresponding to the pinch-off voltage, typically −5 V is applied to the gate electrode to select a high value of channel resistance $R_{1H}$, $R_{2H}$, $R_{3H}$ (FIG. 2). Resistors $R_a$, $R_b$, $R_c$ are used to limit drain-gate current under a strong r.f. drive and also increases isolation between drain and gate electrodes. There is no drain bias circuit for attenuator 10 since FET's 14a-14b are here operated as variable resistors and as such passive operation does not require the use of a drain bias.

Referring now to FIG. 2, an equivalent circuit 10' for the attenuator 10 (FIG. 1) is shown to include a first parallel combination of resistors $R_{1L}$ and $R_{1H}$ and a switch S1 which selects a path between input transmission line 19a, and the switch $S_1$ through one of such resistors $R_{1L}$, $R_{1H}$. The parallel combination of $R_{1L}$, $R_{1H}$, and the switch S1 here represents the equivalent circuit of FET 14a and is connected in series with a switch S2 which selects a path between the switch S2 and one resistor of a second parallel combination of resistors $R_{2L}$ and $R_{2H}$. The switch S2 and the parallel combination of resistors $R_{2L}$, $R_{2H}$ here represents the equivalent circuit of FET 14b. In a preferred embodiment of the invention, $R_{1L}=R_{2L}$ and $R_{1H}=R_{2H}$. A third parallel combination of resistors $R_{3L}$ and $R_{3H}$ and a series connected switch S2 here representing FET 14c is coupled in shunt with the interconnection of the switches S1 and S2, as shown. Resistors $R_{1L}$, $R_{2L}$, $R_{3L}$ here represent the value of the low state or unpinched channel resistance of the corresponding FETS 14a-14c (FIG. 1), whereas, resistors $R_{1H}$, $R_{2H}$, $R_{3H}$ here represent the value of pinched-off or high state value of channel resistance for FETS 14a-14c in accordance with the invention, and switches $S_1$-$S_3$ here represent the switch states of the FETS 14a-14c, respectively. In response to control signals from bias control means 21 (FIG. 1) fed to gate electrodes 15a-15c of FETS 14a-14c (FIG. 1), the value of channel resistance of each FET 14a-14c is selectively changed between the high state and the low state in accordance with the level of the signal. Therefore, as shown in FIG. 2, switches $S_1$-$S_3$ here represent the switching action of the field effect transistors 14a-14c, changing the value of channel resistance between $R_{1L}$-$R_{3L}$ and $R_{1H}$-$R_{3H}$, in accordance with the voltage level of such control signals. In a preferred embodiment of the invention, FETS 14a, 14b and 14c are designed to provide values of resistance in the pinched-off state and the on-state, so that the selected combination of such channel resistances will provide selected predetermined values of attenuation for the attenuator 10 (FIG. 1) and will provide values of input and output impedance substantially equal to a predetermined characteristic impedance value. Preferably, the input and output impedances of the attenuator 10 are equal to the characteristic impedances of the input and output r.f. transmission lines 19a, 19d, respectively. Suffice it here to say that each one of the values of channel resistance of each FET are selected to provide in combination such predetermined value of input impedance in a manner to be described.

Figure 2A:
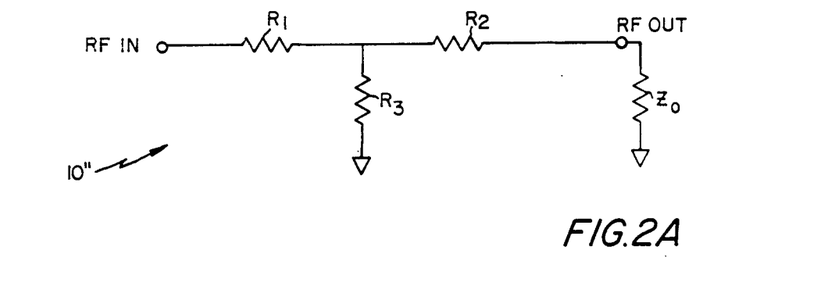
FIG. 2A is a simplified equivalent circuit of the attenuator of FIG. 2 showing a conventional T network for use in deriving certain equations useful in understanding the present invention.

Referring now to FIG. 2A, a simplified equivalent circuit of attenuator 10 (FIG. 1) is shown as a conventional T-section attenuator network 10'' having branch resistor values $R_1$, $R_2$ and a shunt resistor $R_3$. It is to be noted that other attenuation networks such as a π-section network or a ladder network may also be used with the invention. Further, a multi-bit programmable attenuator having a plurality of FET's in each branch and shunt arm may be fabricated using the invention. Resistors $R_1$-$R_3$ here represent channel resistances of FETS 14a-14c in each one of the selected states for such FETS 14a-14c. Here, in operation, the control signal is applied to the gate electrodes 15a, 15b of FETS 14a, 14b respectively and the complement of such signal is applied to the gate electrode 15c of FET 14c to switch said FETS in response to such signals to the selected channel resistance represented by resistor values $R_{1L}$ or $R_{1H}$, $R_{2L}$ or $R_{2H}$, and $R_{3H}$ or $R_{3L}$ in accordance with the voltage level of the signals applied to the gate electrodes 15a-15c. Resistance values $R_{1L}$, $R_{1H}$, $R_{2L}$, $R_{2H}$, $R_{3L}$, $R_{3H}$ are here selected such that any predetermined combination of such resistance values provides an input impedance $Z_{in}$ of the attenuator 10, here preferably equal to $Z_o$, the characteristic impedance of the radio frequency transmission lines 19a, 19d. With these constraints, the input impedance $Z_{in}$ of the simplified equivalent circuit (FIG. 2A) is given as:

$$Z_{in}=(R_1^2+2R_1R_3)^{\frac{1}{2}} \qquad \text{Equation (1)}$$

Further, since the network is symmetrical, the output impedance $Z_{out}$ is likewise given by $(R_2^2+2R_2R_3)^{\frac{1}{2}}$ where $R_1=R_2$.

In a similar manner, a loop analysis of the simplified equivalent circuit of FIG. 2A will provide the following equation for the power attenuation factor for the condition $Z_{in}=Z_o$:

$$A=P_{in}/P_o=(R_1+R_3+Z_o/R_3)^2 \qquad \text{Equation (2)}$$

Using the constraints that the input impedance equals the characteristic impedance, and the attenuation factor is related to the characteristic impedance, the values for resistors $R_1$, $R_2$ and $R_3$ can be shown to be equal to:

$$R_1=Z_o((A)^{\frac{1}{2}}-1)/((A)^{\frac{1}{2}}+1) \text{ and} \qquad \text{Equation (3)}$$

$$R_3=2Z_o(A)^{\frac{1}{2}}/(A-1) \qquad \text{Equation (4)}$$

$$R_1=R_2 \qquad \text{Equation (5)}$$

TABLE 1

$Z_o$ = 50 ohms
(values given are in ohms)

| | A (Eq. 1) | $R_1$ (Eq. 3) | $R_2$ (Eq. 3) | $R_3$ (Eq. 4) | $Z_o$ (Eq. 2) |
|---|---|---|---|---|---|
| $R_{XL}$ | 2 db (1.58) | 5.7 ($R_{1L}$) | 5.7 ($R_{2L}$) | 47 ($R_{3H}$) | 49.9 |
| $R_{XH}$ | 8 db (6.3) | 21.5 ($R_{1H}$) | 21.5 ($R_{2H}$) | 215 ($R_{3L}$) | 49.7 |

As an example, as shown in Table I, for selected values of attenuation, and the selected value of characteristic impedance $Z_o$, the values for $R_1$, $R_2$ and $R_3$ of the equivalent circuit shown in FIG. 2A are calculated for each attenuation state using equations 3, 4 and 5.

Figure 3:
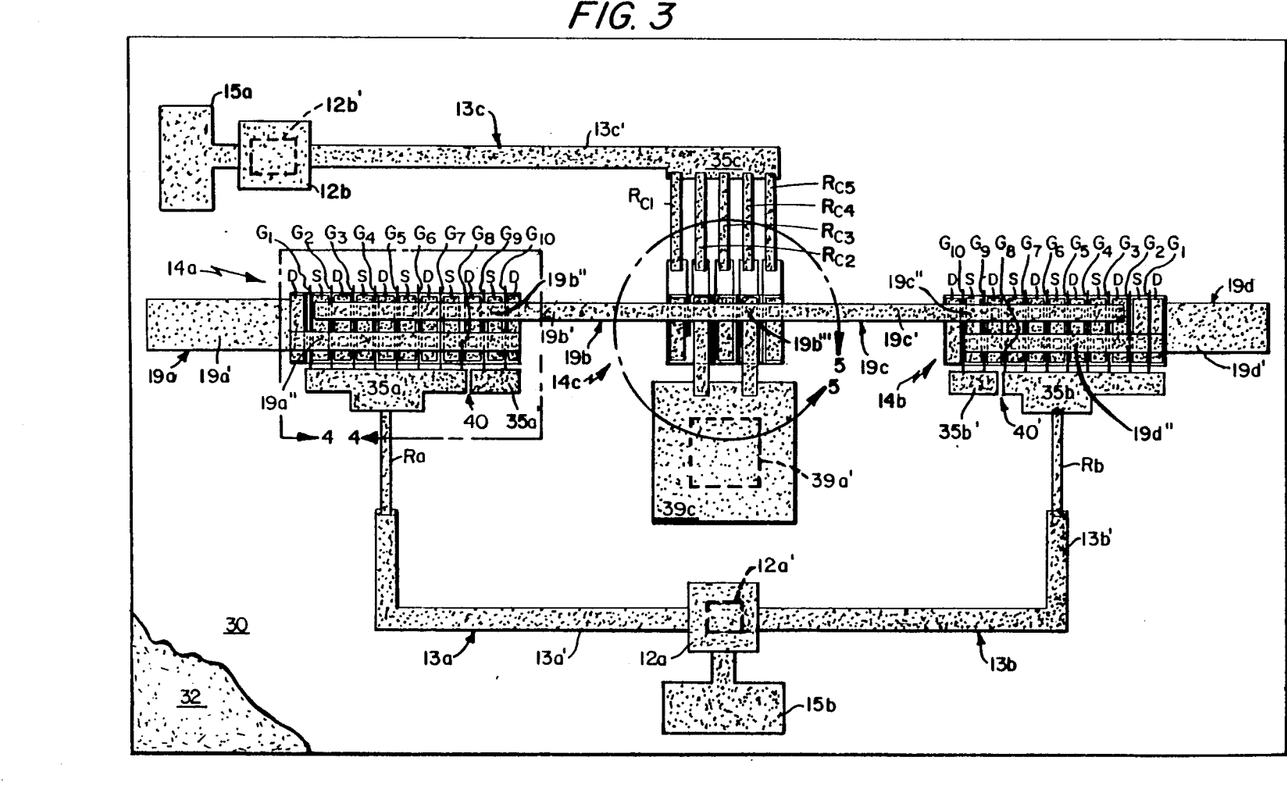
FIG. 3 is a plan view of the attenuator shown in FIG. 1 fabricated as a monolithic integrated circuit.

Referring now to FIG. 3, the digital attenuator circuit 10 is shown formed as a monolithic circuit on a substrate 30, here of semi-insulating gallium arsenide having on a bottom surface thereof a conductive ground plane 32, here of plated gold. On a surface of substrate 30 opposite the ground plane conductor 32 are formed active regions (not shown) wherein are formed FETS 14a, 14b, 14c (FIG. 1). FETS 14a-14c here each include a plurality of channel regions $C_X$ (FIGS. 4A, 5), said channels including gate regions $G_X$ disposed between pairs of source (S) and drain (D) regions. Capacitors 12a-12b are conventionally fabricated parallel plate capacitors having a bottom plate (not shown) coupled to the ground plane by via holes 12a', 12b'. Conductive bonding pads 15a, 15b are provided for connection to bias control means 21 (FIG. 1). On the semi-insulating substrate 30 are provided strip conductors 19a'-19d' and 13a'-13c' for respective ones of transmission lines 19a-19d and 13a-13c (FIG. 1). Thus, here microstrip transmission lines are provided by a combination of the aforementioned strip conductors, semi-insulating substrate 30 and ground plane conductor 32. Further, conventional overlay metallizations 19a''-19d'' and 19b''' are provided to interconnect like ones of drain and source electrodes of each FET 14a-14c, as shown.

Figure 4:
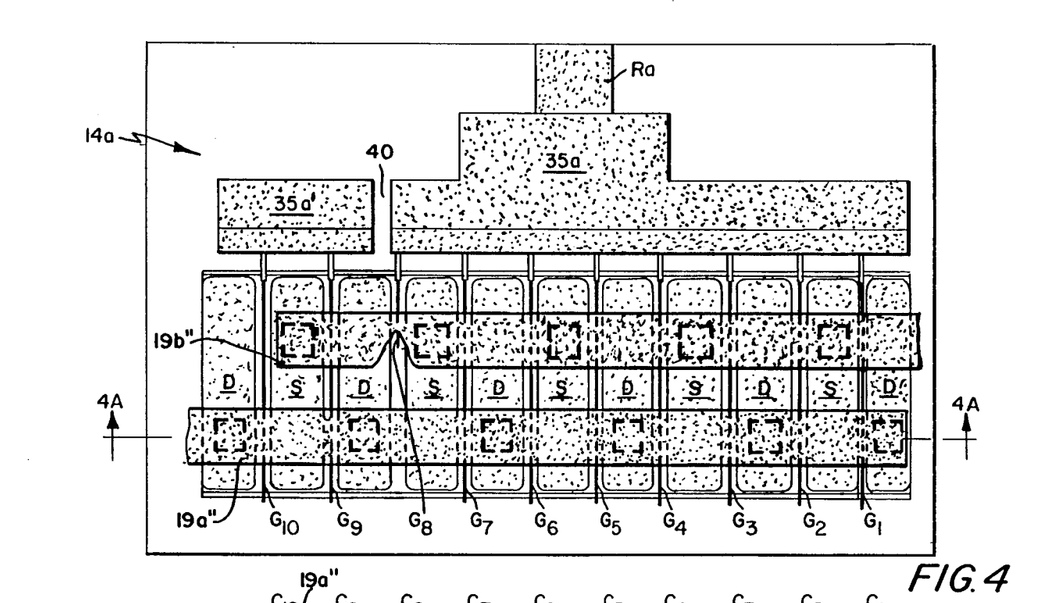
FIG. 4 is an exploded plan view of a transistor used in the attenuator of FIG. 3.
Figure 4A:
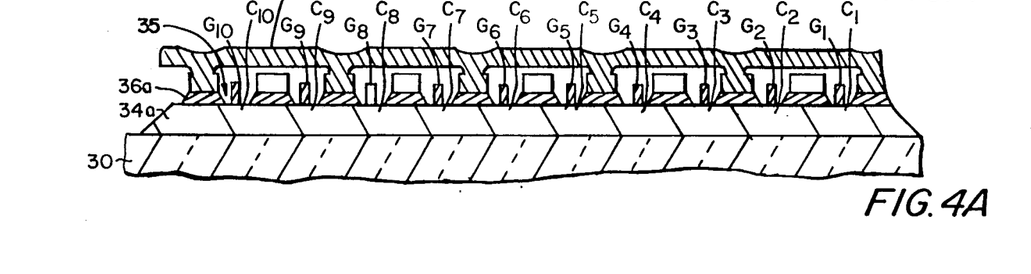
FIG. 4A is a cross-sectional view of the transistor shown in FIG. 4 taken along line 4A—4A.

Referring now to FIGS. 4 and 4A, FET 14a, also representative of FET 14b, is shown to include a mesa-shaped active region 34a, contact region 36a, a plurality of recesses 35 in contact region 36a exposing underlying portions of active layer 34a, and a plurality of channel regions $C_1$-$C_{10}$ disposed in active region 36a between pairs of drain D and source S electrodes and underlying corresponding ones of gate fingers $G_1$-$G_{10}$. Gate fingers $G_1$-$G_8$ are connected to a gate pad 35a (representative of gate electrode 15a, FIG. 1). Gate pad 35a is connected to the resistor $R_a$, and is adapted to receive a control signal from control means 21 at bias point $V_1$ (FIG. 1). Gate fingers $G_9$, $G_{10}$ are connected to gate pad 35a' here spaced from gate pad 35a by a channel 40 provided between said gate pads 35a and 35a'. Further as shown in FIG. 4, gate finger $G_8$ covers a portion of the active region thereunder between respective drain and source contacts. In this manner, field effect transistor 14a is designed to have a selected value of resistance $R_{1H}$ when a voltage signal is applied to gate pad 35a to pinch-off each of the drain source channel regions $C_1$-$C_{10}$. As is known in the art, when a conventional depletion mode field effect transistor, for example, is supplied with a voltage sufficient to cause pinch-off of the channel, a very high channel impedance, typically in the range of thousands of ohms is provided. Here, in order to provide an attenuator having the desired degree of attenuation values and values of resistance to provide in combination a predetermined input impedance preferably equal to the impedance of the radio frequency transmission lines, the field effect transistor 14a, for example, is designed to have a selected value of channel resistance $R_{1L}$ when the field effect transistor is in the "on state" and a selected value of channel resistance $R_{1H}$ when the field effect transistor is in the pinch-off state. The FET 14a further includes conventional drain and source overlay metallization 19a''-19b'' used to interconnect corresponding ones of drain (D) and source (S) electrodes, as shown.

Figure 5:
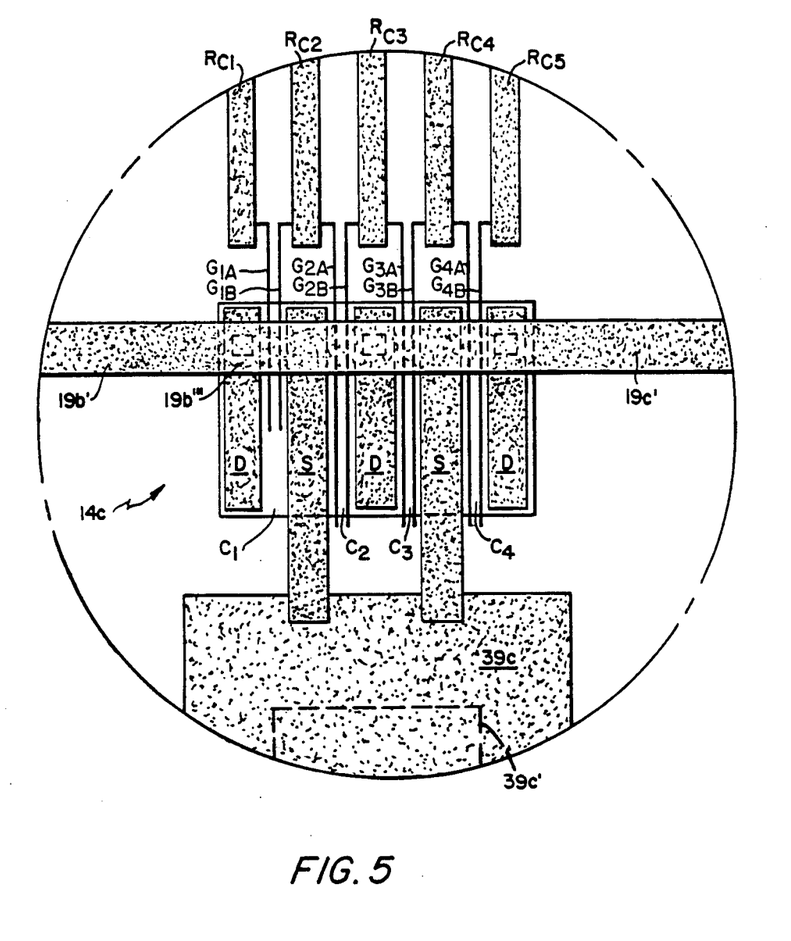
FIG. 5 is an exploded plan view of a dual gate transistor used in the attenuator of FIG. 3.

Referring to FIG. 5, FET 14c is here a dual gate FET having gate finger pairs $G_{1a}$, $G_{1b}$, $G_{2a}$, $G_{2b}$, $G_{3a}$, $G_{3b}$ and $G_{4a}$, $G_{4b}$. Resistors $R_{c1}$-$R_{c5}$ are provided in combination with the pairs of dual gates to increase the isolation between gate and drain electrodes and to increase current limiting and the drain-gate breakdown voltage. Gate pairs $G_{1a}$, $G_{1b}$, $G_{2a}$, $G_{2b}$, $G_{3a}$, $G_{3b}$ and $G_{4a}$, $G_{4b}$ are connected to a gate pad 35c (FIG. 3, representative of gate electrode 15c, FIG. 1) through resistors $R_{c1}$-$R_{c5}$, as shown. Source electrodes (S) of FET 14c are connected to a source pad 39c which is connected to ground through a via hole 39c'.

In operation, a two level voltage signal having a first level sufficient to pinch-off the channel is fed to gate electrode pad 35a. Such voltage signal is distributed to gate electrode fingers $G_1$-$G_8$ disposed between adjacently spaced source and drain electrodes to pinch-off the corresponding source-drain channels $C_1$-$C_8$ of each one of the corresponding FET cells. Thus, such channels $C_1$-$C_8$ disposed under the connected gate fingers $G_1$-$G_8$ will be placed in a pinch-off state. However, since the pinch-off voltage signal is not fed to the portion of the gate pad 35a' spaced by channel 40 from gate pad 35a, such signal therefore is not distributed to channels $C_9$, $C_{10}$ underlying gate fingers $G_9$, $G_{10}$. Further, that portion of the channel $C_8$ isolated from gate finger $G_8$ is in a like manner not pinched-off. Thus, the source-drain channel underlying gate fingers $G_9$, $G_{10}$ will not be placed in a pinch-off state and will present an impedance equal to the "on-state" channel resistance of such channel, and the gate finger $G_8$ disposed on a portion of the total channel $C_9$ width will provide a lower channel resistance in the pinch-off state than those channels $C_1$-$C_8$ having a complete gate finger disposed thereon. Since the channels are coupled in parallel, the total resistance of the field effect transistor between the drain electrode 16a and source electrode 17a when a pinch-off voltage level signal is applied to the gate electrode will be selectively lower than conventional field effect transistors wherein all gate fingers $G_1$-$G_{10}$, for example, would be fed a voltage level signal to place each one of the channels thereof in a pinch-off state.

A generalized equation for finding the equivalent resistance ($R_{1H}$) in pinch-off for the field effect transistor such as that shown in FIG. 4 having n channels, with m channels and portions thereof isolated from the gate pad 35a, having a selected on-state channel resistance equal to $R_o$ ohms per channel, and a selected pinch-off channel resistance of $R_p$ ohms per channel is given as:

$$1/R_{1H}=m/R_o+(1/(R_p/(n-m))) \quad \text{(Equation 6)}$$

As a design example, the FET 14a is selected to have a predetermined resistance gate periphery characteristic. Here, FET's 14a, 14b are each selected to have a resistance-gate periphery characteristic equal to $R_{XL}=3.5$ ohm-mm in the on-state (state where no pinch-off voltage is applied), and a resistance-width characteristic equal to $R_{XH}=2.0K$ ohm-mm in the off-state (state where a pinch-off voltage is applied).

Selecting the FET 14a to have 10 cells, then each unit cell will have a unit cell width $w_o$ given by $w_o=1$ mm/n=1 mm/10=100 μm. Further, each cell will have a unit cell on-state resistance ($r_o$) given by $R_{XL}/w_o=3.5$ ohm-mm/(100 μm/cell)=35 ohms and a unit off-state (pinch-off) channel resistance given by $R_{XH}/w_o=2.0K$ ohms-mm/100 μm/cell=20K ohms.

The required gate periphery $G_p$ for each of FETS 14a, 14b is determined by the desired value of on-state channel resistance ($R_{1L}$) in accordance with the following equation $R_{XL}/R_{1L}=G_p$ where $G_p$ equals the total gate periphery. In the present example, $G_p$ is given as:

$$G_p=R_{XL}/R_{1L}=3.5 \text{ ohm-mm}/5.7 \text{ ohm}=0.614 \text{ mm}.$$

Having found the required total gate periphery ($G_p$) for FET 14a, such total gate periphery $G_p$ is selectively partitioned into the plurality of (n) channels, each channel having a width $W_c$ such that $nW_c=G_p$. In the present example, n=10 as selected above and $W_c$ is thus given by:

$$W_c=0.614 \text{ mm}/10=0.0614 \text{ mm}=61.4 \text{ μm}.$$

Knowing unit channel resistance values $r_o$ and $r_p$, unit channel width $w_o$, and having determined the actual width $W_c=61.4$ μm for each one of the channels $C_1$-$C_{10}$ of FETS 14a, 14b, scaled resistance values per channel ($R_o$, $R_p$) for the FETS 14a, 14b having a 3.5 ohm-mm characteristic, with each cell having a width of 61.4 μm, are determined as follows:

$$w_o r_o/W_c=R_o=(100 \text{ μm})(35 \text{ ohms})/61.4 \text{ μm}=57.0 \text{ ohms}$$

$$w_o r_p/W_c=R_p=(100 \text{ μm})(20K \text{ ohms})/61.4 \text{ μ}32.5K \text{ ohms}$$

Thus, having determined $R_{1H}$ from equation 3, the FET resistance in the pinch-off state, and having calculated $R_o$ the resistance per channel of FETS 14a, 14b in the on-state and $R_p$ the pinch-off resistance per channel of FETS 14a, 14b in the pinch-off state, equation 6 can be solved for m to provide the number of channels required to be isolated from the gate pad 35a to provide the value of FET resistance $R_{1H}$ as determined from equation 3 and given in Table 1. For the above example, solving equation 6 for m provides:

$$m=((R_o R_p/R_{XH})-R_o n)/(R_p-R_o) \text{ or for } R_p>>R_o n$$

$$m \approx R_o/R_{XH} \approx 57 \text{ ohms}/21.5 \text{ ohms} \approx 2.65$$

Therefore, as shown in FIG. 4, gate fingers $G_9$ and $G_{10}$ are isolated from gate pads 35a and $0.65 \times 61.4$ μm=40 μm of channel $C_8$ is isolated from gate pad 35a.

In a similar manner, FET 14c is designed. Here due to the relatively high on-state channel impedance $R_{1L}$, the FET 14c channel is selectively doped such that the FET 14c has a resistance-width characteristic $R_{XL}=14.0$ ohm-mm in the on-state and a resistance-width characteristic equal to $R_{XH}=8K$ ohm-mm in the off-state (64.0 ohms per cell on-state and 32K ohms per cell off-state). The total gate periphery $G_p$ is given by $G_p=R_{XL}/R_{3L}=14$ ohm-mm/47 ohms=0.280 mm. Having determined the total gate periphery, the number of cells can be selected to be an integral number, here 4 and the width of each one of said cells is then given as: $W_c=280$ μm/4 cells=75 μm/cell. Thus, in a similar manner, $r_o=R_{XL}$ n and $r_p=R_{XH}$ n or $r_o=64$ ohms per cell and $r_o=R_{XL}$ n and $r_p=R_{XH}$ n or $r_o=64$ ohms per cell and $r_p=32K$ ohms per cell. Normalized or scaled values $R_o$, $R_p$ for 75 μm wide cells are determined for the 75 μm wide cells of FET 14c in accordance with $w_o(r_o)/W_c=R_o$ or 100 μm(64 ohms)/75 μm=85 ohms and $w_o r_o/W_c=R_p=100$ μm(32K ohms)/75 μm=43.7K ohms. Equation 6 is then solved for m to provide: m≃0.4. Therefore, as shown in FIG. 3, (0.4)(75 μm)=30 μm of channel $C_1$ of FET 14c is isolated from gate pad 35c.

Having described preferred embodiments of the invention, it will now be apparent to one of skill in the art that other embodiments incorporating its concept may be used. It is felt, therefore, that this invention should not be restricted to the disclosed embodiments, but rather should be limited only by the spirit and scope of the appended claims.

What is claimed is:

1. A field effect transistor comprising:
 a drain electrode and a source electrode;
 a region disposed between said drain and source electrodes; and
 a gate electrode having a selected gate width to provide said gate electrode disposed over a first portion of said region with a remaining second portion of said region being isolated from the gate electrode, and with the conductivity between drain and source electrodes through said first portion of said region being controlled between a conductive state and a nonconductive state by a signal having a pair of voltage level states applied to the gate electrode and with the second portion of the region remaining conductive between source and drain electrodes independent of the state of the signal applied to the gate electrode.

2. The field effect transistor as recited in claim 1 wherein the first portion of the region provides a first relatively high resistance between source and drain electrodes when the signal fed to the gate places said region between source and drain electrodes in a substantially non-conducting state; and
 wherein the second portion of the region provides a second relatively low value of resistance between the drain and the source electrodes, with said first and second resistances providing a composite resistance between source and drain electrodes which is substantially less than the first resistance when the first portion of the region having the gate electrode disposed thereon is in the non-conducting pinched-off state.

3. A field effect transistor comprising:
 a plurality of field effect transistor cells, each cell including a drain electrode, a source electrode and a region disposed between said drain and source electrodes;
 a common gate pad electrode; and
 a plurality of gate electrodes connected to the common gate pad electrode, with a first portion of the regions disposed between source and drain electrodes being connected to the gate pad by said plurality of gate electrodes, and a second portion of said regions being isolated from the gate pad electrode.

4. The field effect transistor as recited in claim 3 further comprising:
 a common drain electrode electrically interconnecting each one of the drain regions of each one of the plurality of cells;
 a common source electrode electrically interconnecting each one of the source regions of each one of the cells; and
 wherein the second portion of the channel regions isolated from the gate pad electrode is selected to provide a predetermined value of resistance between the common drain and common source electrodes in response to a signal fed to the gate pad electrode and distributed to the first portion of the channel regions connected to the gate pad electrode.

5. The field effect transistor as recited in claim 4, wherein each cell has a selected on-state channel resistance characteristic $R_o$ and a selected off-state channel resistance characteristic $R_p$, with said field effect transistor having n field effect transistor cells, and a predetermined value of pinch-off resistance ($R_{1H}$) determined by the portion of the regions (m) electrically isolated from the gate pad given as:

$$m \simeq ((R_o R_p / R_{1H}) - (R_o n))/(R_p - R_o).$$

* * * * *

UNITED STATES PATENT AND TRADEMARK OFFICE
CERTIFICATE OF CORRECTION

PATENT NO. : 4,684,965

DATED : August 4, 1987

INVENTOR(S) : Yusuke Tajima et al.

It is certified that error appears in the above-identified patent and that said Letters Patent is hereby corrected as shown below:

Column 7, line 20, delete "$W_o r_p/W_c = R_p = (100 \mu m)(20K\ ohms)/61.4\ \mu 32.5K\ ohms$" and replace with --$W_o r_p/W_c = R_p = (100 \mu m)(20K\ ohms)/61.4\ \mu m = 32.5K\ ohms$--.

Signed and Sealed this

Thirty-first Day of May, 1988

Attest:

DONALD J. QUIGG

*Attesting Officer*  *Commissioner of Patents and Trademarks*